(12) United States Patent
Lee et al.

(10) Patent No.: US 12,091,738 B2
(45) Date of Patent: Sep. 17, 2024

(54) LOW RESISTANCE CONDUCTIVE THIN FILM AND FABRICATION METHOD FOR THE SAME

(71) Applicant: MSWAY Technology Co., Ltd., Seoul (KR)

(72) Inventors: Min Soo Lee, Seoul (KR); Jong Chun Park, Anyang-si (KR)

(73) Assignee: MSWAY Technology Co., Ltd., Seoul (KR)

( * ) Notice: Subject to any disclaimer, the term of this patent is extended or adjusted under 35 U.S.C. 154(b) by 45 days.

(21) Appl. No.: 17/561,841

(22) Filed: Dec. 24, 2021

(65) Prior Publication Data

US 2023/0193446 A1   Jun. 22, 2023

(30) Foreign Application Priority Data

Dec. 21, 2021   (KR) .................. 10-2021-0183875

(51) Int. Cl.
| | | |
|---|---|---|
| *G02B 5/28* | (2006.01) | |
| *C23C 14/02* | (2006.01) | |
| *C23C 14/20* | (2006.01) | |
| *C23C 14/34* | (2006.01) | |
| *G02B 5/20* | (2006.01) | |

(52) U.S. Cl.
CPC .......... *C23C 14/024* (2013.01); *C23C 14/205* (2013.01); *C23C 14/34* (2013.01); *G02B 5/208* (2013.01); *G02B 5/282* (2013.01); *G02B 5/285* (2013.01)

(58) Field of Classification Search
CPC ........ G02B 5/208; G02B 5/282; G02B 5/285; C03C 17/366; C03C 17/3644; C03C 17/3647; C03C 17/3681; B32B 17/1022; B32B 17/10229; C23C 14/14; C23C 14/18; C23C 14/185; C23C 14/20; C23C 14/205
See application file for complete search history.

(56) References Cited

U.S. PATENT DOCUMENTS

| | | | |
|---|---|---|---|
| 6,788,635 B1* | 9/2004 | Aratani | G11B 20/00123 |
| 2002/0140885 A1* | 10/2002 | Ueno | G02B 5/0858 |
| | | | 349/113 |

(Continued)

FOREIGN PATENT DOCUMENTS

| | | |
|---|---|---|
| JP | 2007-194109 A | 8/2007 |
| JP | 2016-012555 A | 1/2016 |

(Continued)

OTHER PUBLICATIONS

Machine translation of KR 2020/0132524 A.*
Office Action issued in Korean Application No. 10-2021-0183875 dated Oct. 16, 2023.

*Primary Examiner* — Z. Jim Yang
(74) *Attorney, Agent, or Firm* — Knobbe, Martens, Olson & Bear, LLP (57) ABSTRACT

A low-resistance conductive thin film is disclosed. The present invention provides a low-resistance conductive thin film including: a substrate; a first capping layer disposed on the substrate; a second capping layer disposed on the first capping layer; a metal layer disposed on the second capping layer; a third capping layer disposed on the metal layer; and a fourth capping layer disposed on the third capping layer.

2 Claims, 4 Drawing Sheets

(56) References Cited

U.S. PATENT DOCUMENTS

| | | | |
|---|---|---|---|
| 2009/0130409 A1* | 5/2009 | Reutler | B32B 17/10036 |
| | | | 204/192.12 |
| 2013/0279000 A1* | 10/2013 | Maeda | B32B 17/1022 |
| | | | 359/360 |
| 2014/0186598 A1* | 7/2014 | Ding | C03C 17/3644 |
| | | | 427/164 |
| 2017/0059750 A1* | 3/2017 | Diguet | G02B 5/0866 |
| 2017/0227694 A1* | 8/2017 | Nakanishi | G02B 5/208 |
| 2018/0244567 A1* | 8/2018 | Singh | C03C 17/366 |
| 2020/0017404 A1* | 1/2020 | Guimard | C03C 17/3652 |
| 2020/0181975 A1* | 6/2020 | Padiyath | E06B 9/24 |

FOREIGN PATENT DOCUMENTS

| | | | | |
|---|---|---|---|---|
| KR | 10-2016-0126070 A | 11/2016 | | |
| KR | 10-2020-0126857 A | 11/2020 | | |
| KR | 20200132524 A * | 11/2020 | | |
| WO | WO-2021214110 A1 * | 10/2021 | | C03C 17/36 |
| WO | WO-2021214111 A1 * | 10/2021 | | |

\* cited by examiner

LOW RESISTANCE CONDUCTIVE THIN FILM AND FABRICATION METHOD FOR THE SAME

CROSS-REFERENCE TO RELATED APPLICATION

This application claims priority to and benefits of Korean Patent Application No. 10-2021-0183875, filed in the Korean Intellectual Property Office on Dec. 21, 2021, the entire contents of which are incorporated herein by reference.

BACKGROUND OF THE INVENTION

(a) Field of the Invention

The present invention relates to a low-resistance conductive thin film and a fabrication method for the same.

This work was supported by the Technology development Program (S2842434) funded by the Ministry of SMEs and Startups (MSS, Korea)

(b) Description of the Related Art

A transparent conductive thin film has high transmittance and high conductivity in a visible light region, and its application fields are diverse, such as solar cells, transparent displays, organic light emitting diodes (OLEDs), insulation films, and smart windows.

The transparent conductive thin film is generally formed as a thin film on a flexible substrate such as polyethylene terephthalate (PET), and has a multi-layered structure in consideration of transmittance, corrosion resistance, and functionality.

As the transparent conductive thin film, an indium oxide-based thin film such as indium tin oxide (ITO) has been widely used. However, the ITO has disadvantages such as being difficult to use as a flexible material and being expensive.

Materials used or studied other than ITO include transparent conducting oxide (TCO), silver nanowire, carbon nanotube (CNT), graphene, conductive polymer, and the like.

As R&D on transparency, conductivity, and durability for each material is in progress, optical and electrical properties of the transparent conductive thin film are gradually improving with the passage of time.

On the other hand, silver (Ag) is a material having very excellent transmittance and conductivity, and is expected to have high performance in the field of transparent conductive thin films. Compared to these properties, silver (Ag) has difficulties in commercialization due to problems such as corrosion due to oxidation.

The above information disclosed in this Background section is only for enhancement of understanding of the background of the invention, and therefore, it may contain information that does not form the prior art that is already known in this country to a person of ordinary skill in the art.

SUMMARY OF THE INVENTION

The present invention has been made in an effort to provide a low-resistance conductive thin film and a fabrication method for the same, capable of having high transmittance, low resistance, and corrosion resistance by solving a corrosion problem of a conductive thin film due to oxidation of silver (Ag).

An exemplary embodiment of the present invention provides a low-resistance conductive thin film, including: a substrate; a metal layer disposed on the substrate; first capping layers respectively disposed on and underneath of the metal layer; and second capping layers respectively disposed on and underneath each of the first capping layers, wherein each of the first capping layers is formed to include any one of ITO, IZO, ZTO, ZIST and ZIS, and each of the second capping layer includes an oxide and a nitride including at least one of Cu, Nb, Sn, Ti, Zn, or Al.

In an exemplary embodiment of the present invention, the metal layer may be an alloy containing silver (Ag) as a main component and to which at least one of niobium (Nb) or gold (Au) is added.

An exemplary embodiment of the present invention provides a low-resistance conductive thin film, including: a substrate; a metal layer configured to include an alloy containing silver (Ag) as a main component and to which at least one of niobium (Nb) or gold (Au) is added; and capping layers respectively formed on and underneath the metal layer.

In an exemplary embodiment of the present invention, the capping layers may include first capping layers respectively disposed on and underneath of the metal layer; and second capping layers respectively disposed on and underneath each of the first capping layers, wherein each of the first capping layers may be formed to include any one of ITO, IZO, ZTO, ZIST and ZIS, and each of the second capping layer includes an oxide and a nitride including at least one of Cu, Nb, Sn, Ti, Zn, or Al.

In an exemplary embodiment of the present invention, the metal layer may include 89.5 at % to 96.5% of silver (Ag), 0.5 at % to 1.5 at % of niobium (Nb), and 3.0 at % to 9.0 at % of gold (Au).

In an exemplary embodiment of the present invention, it may further include an index matching layer formed between the substrate and the first capping layer disposed underneath the metal layer and formed by selecting a medium and a thickness to increase transmittance of the entire thin film.

The present invention has an effect of improving high transmittance, low resistance and corrosion resistance of the conductive thin film by presenting a multi-layered conductive thin film structure containing silver (Ag).

DETAILED DESCRIPTION OF THE EMBODIMENTS

The present invention is intended to illustrate the bars, reference to specific embodiments which may have a number of embodiments can be applied to various changes and describes them in detail from the following detailed description. This, However, is by no means to restrict the invention to the specific embodiments, it is to be understood as embracing all included in the spirit and scope of the present invention changes, equivalents and substitutes.

In the following description of the present invention, when it is determined that a detailed description of known techniques that may obscure the subject matter of the present invention, a detailed description thereof will be omitted.

Hereinafter, an exemplary embodiment of the present invention will be described in detail with reference to accompanying drawings.

Figure 1:
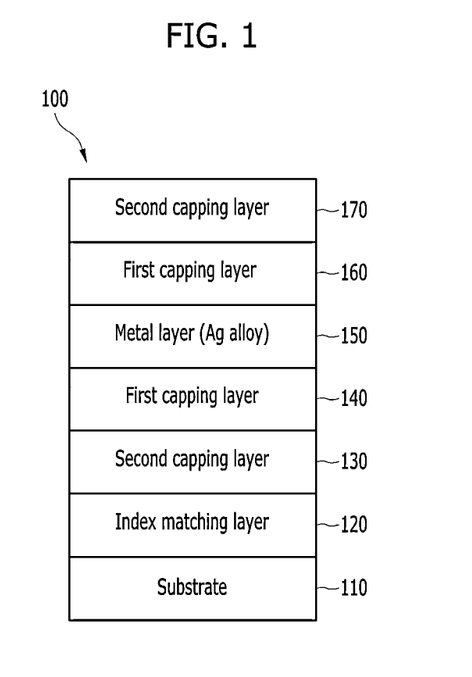
FIG. 1 illustrates a low-resistance conductive thin film according to an exemplary embodiment of the present invention.

FIG. 1 illustrates a low-resistance conductive thin film 100 according to an exemplary embodiment of the present invention.

Referring to FIG. 1, the low-resistance conductive thin film 100 according to the exemplary embodiment of the present invention includes a substrate 110, an index matching layer 120, first capping layers 140 and 160, second capping layers 130 and 170, and a metal layer 150.

The substrate 110 may include an inorganic material or an organic material.

The inorganic material may be any one or a combination of glass, quartz, $Al_2O_3$, SiC, Si, GaAs, and InP, but the present invention is not limited thereto.

The organic material may be selected from among Kepton foil, polyimide (PI), polyethersulfone (PES), polyacrylate (PAR), polyetherimide (PEI), polyethylene naphthalate (PEN), polyethyleneterephthalate (PET), polyphenylene sulfide (PPS), polyarylate (polyarylate), polycarbonate (PC), cellulose triacetate (CTA), and cellulose acetate propionate (CAP), but the present invention is not limited thereto.

However, since the present invention is to achieve low resistance and high light transmittance, the substrate 110 is preferably selected in consideration of a suitable thickness, index, and the like.

In an exemplary embodiment of the present invention, the substrate 110 includes polyethylene terephthalate (PET).

The index matching layer 120 is disposed on the substrate 110.

The index matching layer 120 may be provided to optimize transmittance. The index matching layer 120 may have a material (i.e., refractive index) and a thickness selected to achieve optimal transmittance under a given condition. For example, when a refractive index of a medium forming each layer is high, the index matching layer 120 may be selected to have a relatively low refractive index. This is because, when the refractive index of the medium forming each layer is selected to be relatively high, the reflectance may be increased, and resultantly, the transmittance may be lowered. Accordingly, at least one of a material or a thickness of the index matching layer 120 may be selected to adjust overall transmittance as in the above example.

In an exemplary embodiment of the present invention, the index matching layer 120 may include a compound of two or more components. For example, the index matching layer 120 may include any one of $Nb_2O_x$, $SiN_x$, $SiO_x$, ZnO, AZO, $TiO_x$, $AiN_x$, WON, ZTS, and ZIST. Herein, x may indicate any integer or real number.

The second capping layer 130 is disposed on the index matching layer 120.

The second capping layers 130 and 170 may include a three-component or higher compound. For example, the second capping layers 130 and 170 may include any one of ITO, IZO, ZTO, ZIST, ZIT, and ZIS.

The second capping layers 130 and 170 may be formed to a thickness of 5 nm to 40 nm. When the thickness of the second capping layer is less than 5 nm, it is difficult to form the layer itself, and when it is more than 40 nm, optical characteristics are affected, the transmittance is lowered, and a color difference is off-center.

The second capping layers 130 and 170 may suppress oxidation of silver (Ag) by blocking external oxygen and moisture.

Another second capping layer 170 are formed on the first capping layer 160 formed on the metal layer 150.

The first capping layer 140 is disposed on the second capping layer 130.

The first capping layer 140 and 160 are a protective layer in direct contact with the metal layer 150, and suppresses migration of silver (Ag).

The first capping layers 140 and 160 may include a two-component or higher compound. For example, the first capping layers 140 and 160 may include an oxide and a nitride including at least one of Cu, Nb, Sn, Ti, Zn, or Al. The first capping layer 140 may include a metal single layer of any one selected from a group consisting of Cu, Nb, Sn, Ti, Zn, and Al.

The first capping layers 140 and 160 may be formed to a thickness of 2 nm to 10 nm. When the thickness of the first capping layer 140 and 160 are less than 2 nm, it is difficult to function as a capping layer because it is not formed into a thin film because deposition is not good, and when it exceeds 10 nm, the transmittance deteriorates because optical characteristics deteriorate.

Another first capping layer 160 is formed on the metal layer 150.

The metal layer 150 is disposed on the first capping layer 140.

The metal layer 150 may be formed as a single metal layer 150 of silver (Ag).

In an exemplary embodiment of the present invention, the metal layer 150 has silver (Ag) as a main component, but may include an alloy to which at least one of niobium (Nb) or gold (Au) is added.

Preferably, the metal layer 150 may include 89.5 at % to 96.5 at % of silver (Ag), 0.5 at % to 1.5 at % of niobium (Nb), and 3.0 at % to 9.0 at % of gold (Au). However, metals such as Pd, Cu, Fe, Ni, Pb, Sn, Zn, Mg, Cd, C, and Ta may be included as unavoidable components, and a concentration thereof may be 100 mass ppm or less.

A concentration of oxygen inevitably included in the metal layer 150 may be 1000 mass ppm or less.

Niobium (Nb) is present in an alloy as an intermetallic compound. When niobium (Nb) is included as a component in the alloy, ductility and malleability may be improved, and coarsening of grains may be prevented by increasing a coarsening temperature of the grains at a high temperature. In addition, when niobium (Nb) is included as a component in the alloy, it improves high-temperature oxidation resistance, and contributes to forming an oxide film having good adhesion to the alloy. In addition, niobium (Nb) may increase a yield point and strength at room temperature and high temperature. It may be preferable to contain 0.5 at % or more of niobium (Nb) in order to provide such characteristics.

However, when a content of niobium (Nb) exceeds 1.5 at %, inherent conductivity of silver (Ag) is reduced, so it may be preferable to be included in the metal layer 150 at 1.5 at % or less.

When gold (Au) is included in 3.0 at % or more, there is an advantage of inhibiting migration of silver (Ag), but when it is included in less than 3.0 at %, the effect of inhibiting migration of silver (Ag) is reduced.

When a content of gold (Au) exceeds 9.0 at %, the specific resistance is lowered compared to when the metal layer 150 is formed of pure silver (Ag), so that the resistance may be increased, the optical characteristics may also be reduced, and a fabrication cost may also be increased.

The upper first capping layer 160 is disposed on the metal layer 150.

The first capping layer 160 is formed at a position symmetrical to the lower first capping layer 140 with respect to the metal layer 150.

The first capping layer 160 is a protective layer in direct contact with the metal layer 150, and suppresses migration of silver (Ag).

The first capping layer 160 on the metal layer 150 may be formed of the same material and thickness as the lower first capping layer 140, but is not necessarily formed of the same material and thickness. The material and thickness constituting the first capping layer 160 are selected from the above examples and ranges, but may be formed of a material and thickness different from those of the lower first capping layer 140.

Another second capping layer 170 is disposed on the first capping layer 160.

The second capping layer 170 is formed at a position symmetrical to the lower second capping layer 130 with respect to the metal layer 150.

The upper second capping layer 170 may be formed of the same material and thickness as the lower second capping layer 130, but is not necessarily formed of the same material and thickness. The material and thickness constituting the second capping layer 170 are selected from the above examples and ranges, but may be formed of a material and thickness different from those of the second capping layer 130.

Figure 2:
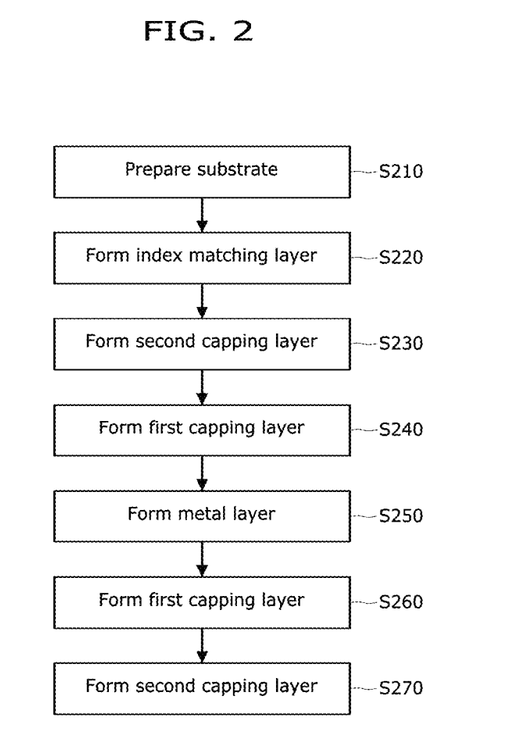
FIG. 2 illustrates a fabrication method for a low-resistance conductive thin film according to an exemplary embodiment of the present invention.

FIG. 2 illustrates a fabrication method for the low-resistance conductive thin film 100 according to an exemplary embodiment of the present invention.

Referring to FIG. 2, the substrate 110 is prepared in step S210.

The substrate 110 may include an inorganic material or an organic material, and any one of the above-described examples of the substrate 110 may be selected. In an exemplary embodiment of the present invention, the substrate 110 includes polyethylene terephthalate (PET).

In step S220, the index matching layer 120 is formed on the substrate 110.

As the index matching layer 120, any one of the above-described examples of the index matching layers 120 may be selected.

The index matching layer 120 may be formed on the substrate 110 by preparing a solution related to a material capable of achieving a desired refractive index and by using any one method selected from among a spin coating method, a roll coating method, a spray coating method, a flow coating method, an inkjet printing method, a nozzle printing method, a dip coating method, an electrophoretic deposition method, a tape casting method, a screen printing method, a pad printing method, a doctor blade coating method, a gravure printing method, a gravure offset printing method, and a langmuir-Blogett method.

In step S230, the second capping layer 130 is formed on the index matching layer 120.

The second capping layer 130 may include a three-component or higher compound. For example, the second capping layer 130 may include any one of ITO, IZO, ZTO, ZIST, ZIT, and ZIS, and may have a thickness of 5 nm to 40 nm.

In step S240, the first capping layer 140 is formed on the second capping layer 130.

The first capping layer 140 is a protective layer in direct contact with the metal layer 150, and may include a compound of two or more components to suppress migration of silver (Ag).

For example, the first capping layer 140 may include an oxide and a nitride including at least one of Cu, Nb, Sn, Ti, Zn, or Al. The first capping layer 140 may include a metal single layer of any one selected from a group consisting of Cu, Nb, Sn, Ti, Zn, and Al, and may be formed to a thickness of 2 nm to 10 nm.

In step S250, a metal layer 150 is formed on the first capping layer 140.

The metal layer 150 may be determined as a target to be sputtered such that silver (Ag), niobium (Nb), and gold (Au) may be included in a desired ratio.

Preferably, the metal layer 150 may include 89.5 at % to 96.5% of silver (Ag), 0.5 at % to 1.5 at % of niobium (Nb), and 3.0 at % to 9.0 at % of gold (Au). However, metals such as Pd, Cu, Fe, Ni, Pb, Sn, Zn, Mg, Cd, C, and Ta may be included as unavoidable components of the target to be sputtered, and a concentration thereof may be 100 mass ppm or less.

A concentration of oxygen inevitably included in the metal layer 150 may be 1000 mass ppm or less.

In step S260, the first capping layer 160 is formed on the metal layer 150.

The first capping layer 160 may be formed of the same material and thickness as the lower first capping layer 140, but is not necessarily formed of the same material and thickness. The material and thickness constituting the first capping layer 160 are selected from the above examples and ranges, but may be formed of a material and thickness different from those of the lower first capping layer 140.

In step S270, a second capping layer 170 is formed on the first capping layer 160.

The second capping layer 170 may be formed of the same material and thickness as the second capping layer 140, but is not necessarily formed of the same material and thickness. The material and thickness constituting the second capping layer 170 are selected from the above examples and ranges, but may be formed of a material and thickness different from those of the lower second capping layer 140.

Figure 3:
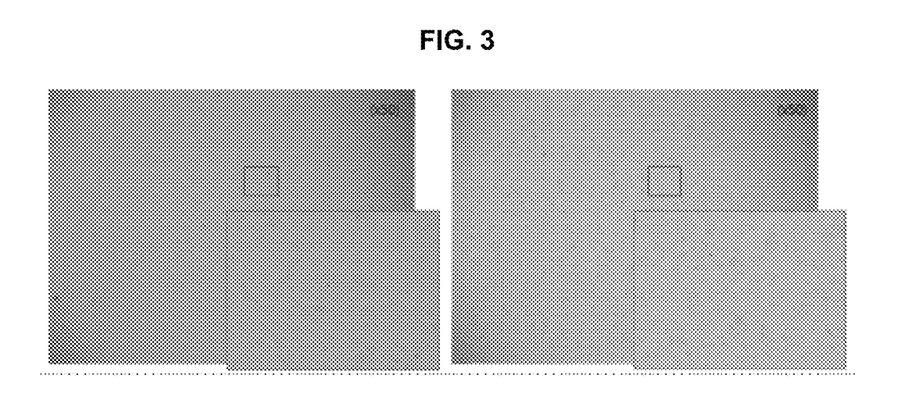
FIG. 3 illustrates observation of a surface after depositing only a metal layer on a substrate.

FIG. 3 illustrates a comparative example in which silver (Ag) is deposited as a metal layer 150 directly on the substrate 110 and is left at room temperature for 24 hours, and a surface thereof is observed.

It was checked that the thin film had a number of spots just by leaving it at room temperature. Such spots may be generated as silver (Ag) forming the metal layer 150 is combined with oxygen or moisture in an atmosphere.

Figure 4:
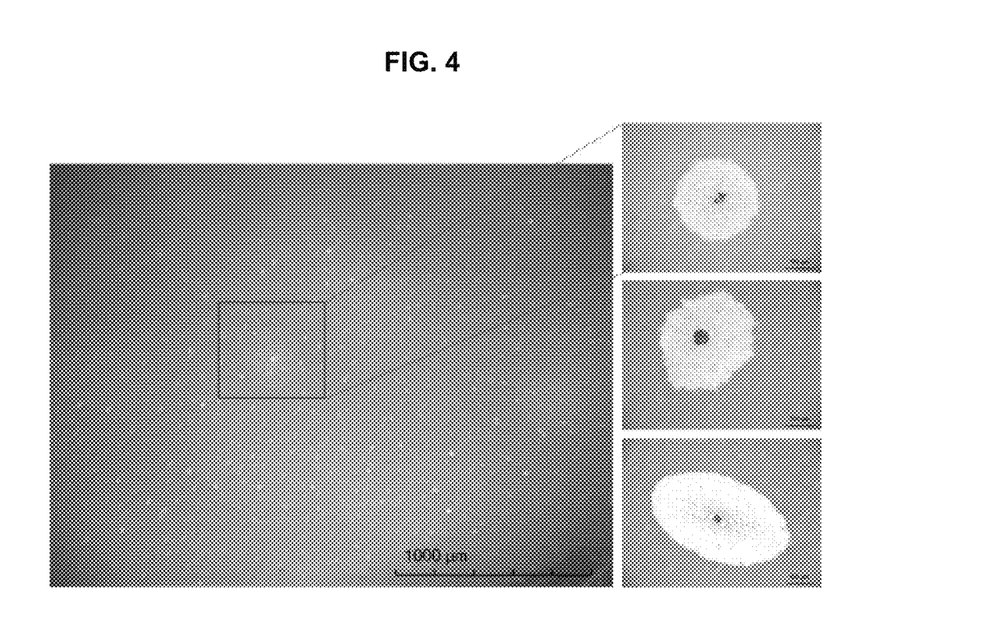
FIG. 4 illustrates observation of a surface of a film in which only a metal layer and an ITO layer are stacked on a substrate.

FIG. 4 illustrates a comparative example, showing a result of leaving a film in which an ITO layer, a silver (Ag) thin film layer, and an ITO layer are sequentially stacked on the substrate 110 at a temperature of 60° C. and a humidity of 90% for 120 hours.

Similarly, in this comparative example, a large number of spots were observed, indicating that there was a problem of migration of silver (Ag).

Figure 5:
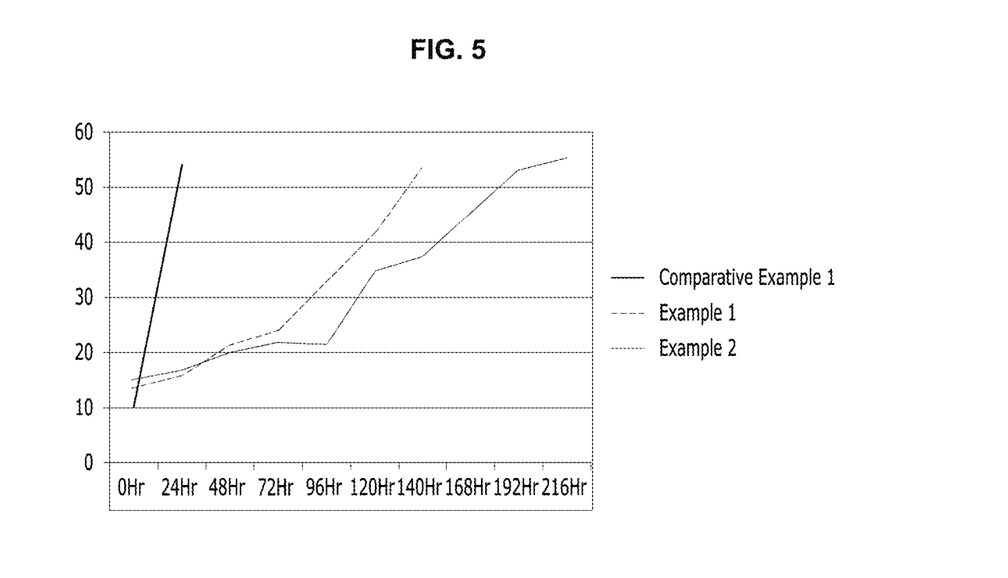
FIG. 5 illustrates a graph showing a change in sheet resistance with time under different conditions.

FIG. 5 illustrates a change in sheet resistance over time at a temperature of 85° C. and a humidity of 85% when conditions of components constituting the metal layer 150 are changed.

Conditions of Comparative Example 1, Example 1 and Example 2 are as follows.

Comparative Example 1

Substrate 110: PET, 125 nm
Index matching layer 120: $Nb_2O_x$, 15 nm
Metal layer 150: silver (Ag) single layer, 10 nm Example 1

Substrate 110: PET, 125 nm
Index matching layer 120: $Nb_2O_x$, 15 nm
Metal layer 150: alloy of silver (Ag) 96 at %, niobium (Nb) 1.0 at %, gold (Au) 3.0 at %, 10 nm Example 2

Substrate 110: PET, 125 nm
Index matching layer 120: $Nb_2O_x$, 15 nm
Metal layer 150: alloy of silver (Ag) 92 at %, niobium (Nb) 1.0 at %, gold (Au) 7.0 at %, 10 nm As a result of the test, it can be seen that in Comparative Example 1, the sheet resistance increased by more than 5 times (50Ω/□) within 24 hours compared to the first (10Ω/□).

In Example 1, it took 140 hours to reach a same resistance value (50Ω/□), and in Example 2, it took 216 hours, indicating that durability is superior to that of Comparative Example 1.

This is because Nb and Au, which are components of the alloy, suppress migration of silver.

Figure 6:
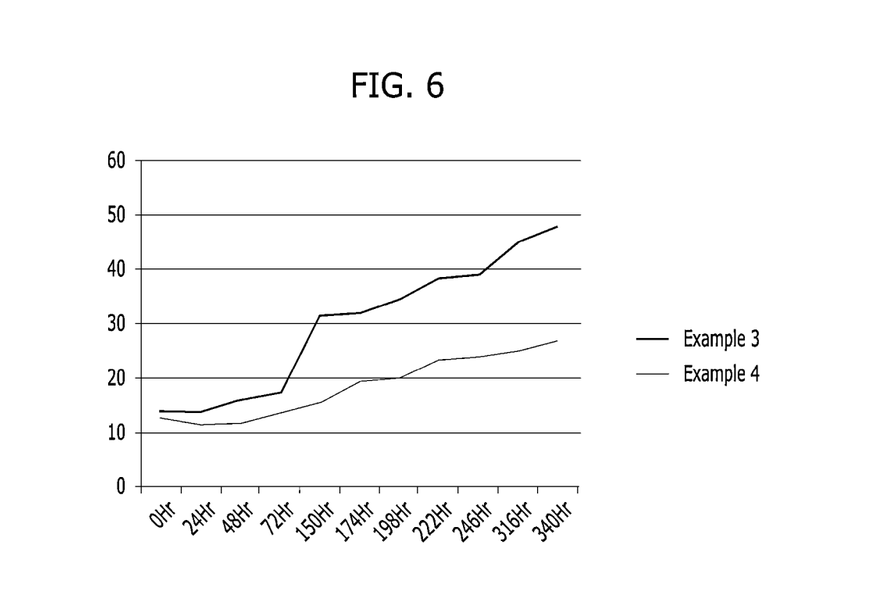
FIG. 6 illustrates a graph showing a change in sheet resistance with time under different conditions.

FIG. 6 illustrates a change in sheet resistance over time at a temperature of 85° C. and a humidity of 85% when the metal layer 150 is made of silver (Ag) and the first capping layers 140 and 160 are applied. In these examples, the metal layer was formed of a single layer of silver (Ag) rather than an alloy in order to more dramatically observe the change of the metal layer 150 due to migration, etc.

Conditions of Example 3 and Example 4 are as follows.

Example 3

Substrate 110: PET, 125 nm
Index matching layer 120: $Nb_2O_x$, 15 nm
First capping layers 140 and 160: $CuO_x$, 2 nm
Metal layer 150: Ag, 10 nm Example 4

Substrate 110: PET, 125 nm
Index matching layer 120: $Nb_2O_x$, 15 nm
First capping layers 140 and 160: $CuO_x$, 5 nm
Metal layer 150: Ag, 10 nm As a result of the experiment, it was found that a change in sheet resistance was slower than in the example in which the capping layer was not present in both Examples 3 and 4.

It was found that a structure of Example 4, in which the capping layer had a relatively thicker thickness, had better durability against changes in sheet resistance than in Example 3, in which the capping layer was relatively thin.

Figure 7:
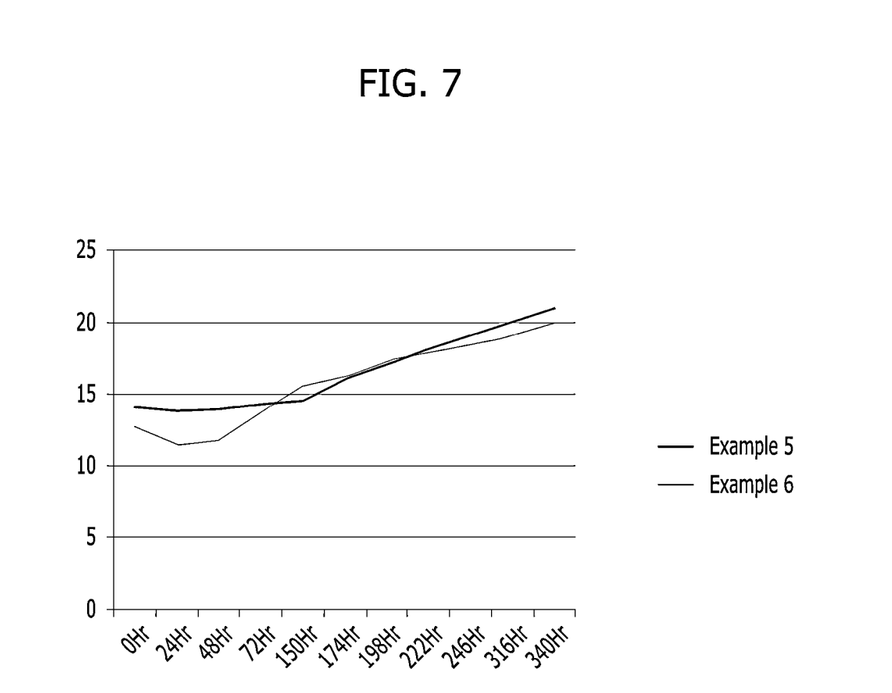
FIG. 7 illustrates a graph showing a change in sheet resistance with time under different conditions.

FIG. 7 illustrates a change in sheet resistance over time at a temperature of 85° C. and a humidity of 85% when the metal layer 150 is made of silver (Ag) and the first capping layers 140 and 160 and the second capping layer 130 and 170 are applied. In these examples, the metal layer was formed of a single layer of silver (Ag) rather than an alloy in order to more dramatically observe the change of the metal layer 150 due to migration, etc.

Conditions of Example 5 and Example 6 are as follows.

Example 5

Substrate 110: PET, 125 nm
Index matching layer 120: $Nb_2O_x$, 15 nm
First capping layers 140 and 160: $CuO_x$, 2 nm
Second capping layers 130 and 170: IZO, 20 nm
Metal layer 150: Ag, 10 nm Example 6

Substrate 110: PET, 125 nm
Index matching layer 120: $Nb_2O_x$, 15 nm
First capping layers 140 and 160: $CuO_x$, 5 nm
Second capping layers 130 and 170: IZO, 20 nm
Metal layer 150: Ag, 10 nm As a result of the experiment, it was found that a change in sheet resistance was more slowed in Examples 5 and 6 compared to the case in which the capping layer was formed as a single layer (the first capping layer). In both Examples 5 and 6, despite a lapse of 340 hours in a test environment, a result of not reaching twice initial resistance was reproduced, and thus it can be seen that the durability was significantly improved to an extent that almost no trace of corrosion was found.

In Example 7, a state of a thin film including the substrate 110, the first capping layers 140 and 160, the second capping layers 130 and 170, and the metal layer 150 was measured until 480 hours elapsed under conditions of a temperature of 85° C. and a humidity of 85%. Conditions of Example 7 are shown below, and the test results are shown in [Table 1].

Example 7

Substrate 110: PET, 125 nm
Index matching layer 120: $Nb_2O_x$, 15 nm
First capping layers 140 and 160: $CuO_x$, 5 nm
Second capping layers 130 and 170: IZO, 20 nm
Metal layer 150: alloy of 92 at % silver (Ag), 1 at % niobium (Nb), and 7 at % gold (Au), 10 nm

TABLE 1

| Time lapse (hour) | Measurement method | Y | @550 nm | Δ(Y) | Sheet resistance(Ω/□) |
|---|---|---|---|---|---|
| 0 | Transmission | 85.33 | 86.04 | — | 13.71 |
|   | Reflection | 4.66 | 4.20 |  |  |
| 120 | Transmission | 85.53 | 86.28 | 0.20 | 12.63 |
|   | Reflection | 4.54 | 3.92 | −0.12 |  |
| 240 | Transmission | 85.49 | 86.43 | 0.16 | 12.48 |
|   | Reflection | 4.37 | 3.74 | −0.29 |  |
| 480 | Transmission | 85.53 | 86.33 | 0.20 | 12.60 |
|   | Reflection | 4.39 | 3.90 | −0.27 |  |

In the table above, Y indicates luminance, @550 nm indicates transmittance and reflectance at @550 nm wavelength, and A indicates a change in a value of luminance Y compared to initial measurement.

It can be seen that the thin film in Example 7 had almost no change in the initial transmittance, reflectance, and sheet resistance until 480 hours, which is twice as long as 240 hours, which is an index of reliability, so it could be concluded that it had excellent reliability.

It is also to be understood that the terminology used herein is only for the purpose of describing particular embodiments, and is not intended to be limiting of the invention. It will be further understood that terms "comprise" or "have" used in the present specification specifies the presence of stated features, numerals, steps, operations, components, parts, or a combination thereof, but does not preclude the presence or addition of one or more other features, numerals, steps, operations, components, parts, or a combination thereof.

DESCRIPTION OF SYMBOLS

100: low resistance conductive thin film
110: substrate
120: index matching layer
130: second capping layer
140: first capping layer
150: metal layer
160: first capping layer
170: second capping layer

What is claimed is:

1. A low-resistance conductive thin film comprising:
   a substrate;
   a metal layer disposed on the substrate;
   first capping layers respectively disposed on and underneath of the metal layer; and,
   second capping layers disposed on the first capping layer that is disposed on the metal layer and disposed underneath the first capping layer that is disposed underneath the metal layer;
   wherein each of the first capping layers includes CuOx;
   wherein each of the second capping layers is formed to include IZO;
   wherein the metal layer is an alloy containing silver (Ag) as a main component and to which niobium (Nb) or gold (Au) is added; and
   wherein the metal layer includes 92 at % of silver (Ag), 1 at % of niobium (Nb), and 7 at % of gold (Au) and formed to have a thickness of 10 nm.

2. The low-resistance conductive thin film of claim 1, further comprising:
   an index matching layer formed between the substrate and the second capping layer disposed underneath the metal layer;
   wherein the substrate includes PET and formed to have a thickness of 125 nm;
   wherein the index matching layer includes NbOx and formed to have a thickness of 15 nm;
   wherein each of the first capping layers has a thickness of 5 nm; and
   wherein each of the second capping layers has a thickness of 20 nm.

* * * * *